United States Patent
Oshikiri

(10) Patent No.: US 7,663,920 B2
(45) Date of Patent: Feb. 16, 2010

(54) MEMORY SYSTEM AND DATA READING AND GENERATING METHOD

(75) Inventor: Takashi Oshikiri, Osaka (JP)

(73) Assignee: MegaChips Corporation, Osaka (JP)

( * ) Notice: Subject to any disclaimer, the term of this patent is extended or adjusted under 35 U.S.C. 154(b) by 365 days.

(21) Appl. No.: 11/832,898

(22) Filed: Aug. 2, 2007

(65) Prior Publication Data

US 2008/0181004 A1 Jul. 31, 2008

(30) Foreign Application Priority Data

Aug. 9, 2006 (JP) ............................. 2006-216741

(51) Int. Cl.
*G11C 16/04* (2006.01)
(52) U.S. Cl. ........................... 365/185.12; 365/185.03; 365/230.02
(58) Field of Classification Search ............ 365/185.12, 365/185.03, 230.02
See application file for complete search history.

(56) References Cited

U.S. PATENT DOCUMENTS 6,657,891 B1 * 12/2003 Shibata et al. ......... 365/185.03
7,577,880 B2 * 8/2009 Hazama ...................... 714/701

FOREIGN PATENT DOCUMENTS

JP   2002-024090   1/2002
JP   2003-162433   6/2003

* cited by examiner

*Primary Examiner*—Amir Zarabian
*Assistant Examiner*—Fernando N Hidalgo
(74) *Attorney, Agent, or Firm*—Oblon, Spivak, McClelland, Maier & Neustadt, L.L.P.

(57) ABSTRACT

An object of the present invention is to provide a memory system that offers enhanced security of ROM code that is data whose contents can be utilized for a given purpose in its intact form. In a memory system, data is read from a memory according to at least two or more addresses outputted from an address generator, from individual pages uniquely specified respectively by the addresses. A data generator generates one piece of data on the basis of the at least two or more pieces of data read from the individual pages.

52 Claims, 8 Drawing Sheets

F I G . 5

| INPUT SIGNAL | i 1 | i 2 | i 3 | i 4 |
|---|---|---|---|---|
| ADDRESS INCLUDED IN INPUT SIGNAL | A | C | E | G |
| GENERATED ADDRESS | B | D | F | H |
| OUTPUTTED ADDRESSES | A , B | C , D | E , F | G , H |

F I G . 6

| INPUT SIGNAL | i 1 | i 2 | i 3 | i 4 |
|---|---|---|---|---|
| ADDRESS INCLUDED IN INPUT SIGNAL | A | E | I | M |
| GENERATED ADDRESSES | B, C, D | F, G, H | J, K, L | N, O, P |
| OUTPUTTED ADDRESSES | A, B, C, D | E, F, G, H | I, J, K, L | M, N, O, P |

F I G . 7

| INPUT SIGNAL | I 1 | I 2 | I 3 | I 4 |
|---|---|---|---|---|
| ADDRESS INCLUDED IN INPUT SIGNAL | NONE | NONE | NONE | NONE |
| GENERATED ADDRESSES | A, B | C, D | E, F | G, H |
| OUTPUTTED ADDRESSES | A, B | C, D | E, F | G, H |

F I G . 8

| INPUT SIGNAL | I 1 | I 2 | I 3 | I 4 |
|---|---|---|---|---|
| ADDRESS INCLUDED IN INPUT SIGNAL | NONE | NONE | NONE | NONE |
| GENERATED ADDRESSES | A, B, C | D, E, F | G, H, I | J, K, L |
| OUTPUTTED ADDRESSES | A, B, C | D, E, F | G, H, I | J, K, L |

F I G . 9
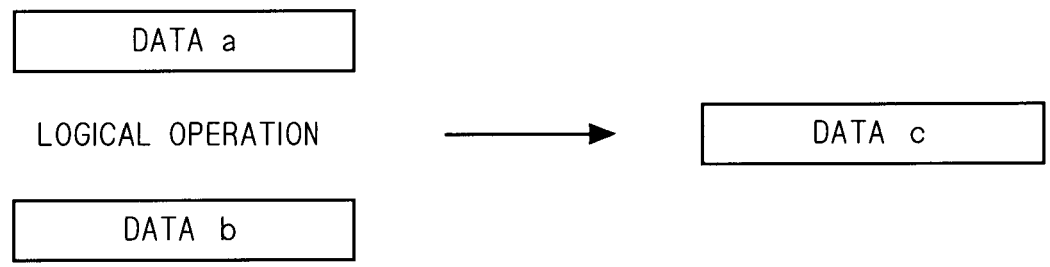

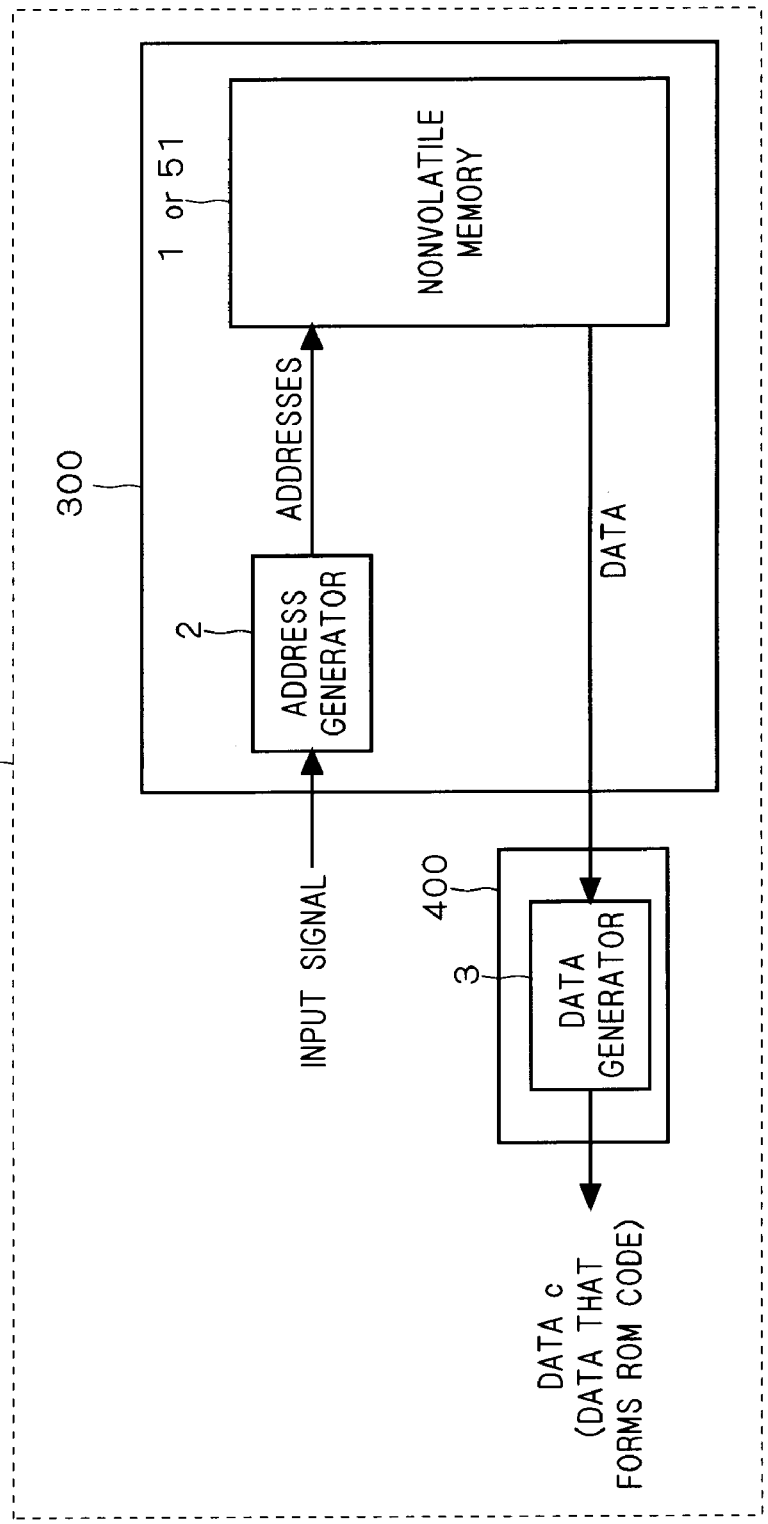

MEMORY SYSTEM AND DATA READING AND GENERATING METHOD

BACKGROUND OF THE INVENTION

1. Field of the Invention

The present invention relates to a memory system and a data reading and generating method, which can be applied, for example, to a memory system having a nonvolatile memory for storing content like game data, and to a data reading and generating method for reading data from the nonvolatile memory and generating new data from the read data.

2. Description of the Background Art

Conventionally, there are nonvolatile semiconductor memories used to store content like game data. Also, there are conventional memory systems that include such a nonvolatile semiconductor memory and a controller for reading data from the nonvolatile semiconductor memory (for example, see Japanese Patent Application Laid-Open No. 2003-162433 (hereinafter referred to as Patent Document 1)).

Also, Japanese Patent Application Laid-Open No. 2002-24090 (hereinafter referred to as Patent Document 2), for example, discloses a conventional technique related to a nonvolatile semiconductor memory. The technique of Patent Document 2 enables protection of the data contained in the nonvolatile memory.

In the techniques disclosed in Patent Documents 1 and 2, the nonvolatile semiconductor memories (hereinafter referred to simply as nonvolatile memories) store ROM code itself (hereinafter, data whose contents can be utilized for a given purpose in its intact form is referred to as ROM code).

Accordingly, the ROM code stored in the nonvolatile memory can be extracted by accessing the nonvolatile memory (that is, by observing the chip itself). Thus, the contents of the ROM code can be easily utilized, and the ROM code itself can be easily extracted, and therefore it is not possible to ensure the security of the content like game data (which can be regarded also as ROM code) when the content is stored as ROM code in the nonvolatile memory.

SUMMARY OF THE INVENTION

An object of the present invention is to provide a memory system and a data reading and generating method that offer enhanced security of ROM code.

According to a first aspect of the present invention, a memory system includes a memory, an address generator, and a data generator. The memory is divided into a plurality of pages and capable of data reading on a page-by-page basis. The address generator generates one or more given address(es) on the basis of an input signal and outputs at least two or more addresses. The memory is configured such that at least two or more pieces of data can be read according to the at least two or more addresses outputted from the address generator. The at least two or more pieces of data are read respectively from the individual pages uniquely specified by the addresses. The data generator generates one piece of data on the basis of the at least two or more pieces of data read respectively from the pages of the memory.

Accordingly, even if data pieces are extracted from the memory, it is impossible to reproduce the one piece of data on the basis of the extracted data pieces when the data generating method in the data generator is unknown. This enhances the security of the one piece of data. Also, when the address generating method in the address generator is unknown, it is impossible to extract the data pieces as a basis for the generation of the one piece of data. This also enhances the security of the one piece of data.

According to a second aspect of the present invention, in the memory system, the memory is divided into a plurality of sectors each including a plurality of pages. The memory is capable of data erasure on a sector-by-sector basis. The pages of the memory where the at least two or more pieces of data are stored belong to different ones of the sectors.

Accordingly, as in the first aspect of the invention, the security of the generated one piece of data is enhanced also when the memory is configured with sectors and pages.

According to a third aspect of the present invention, the input signal is a signal that includes a first address. The address generator outputs the first address and at least one or more second address(es) that are uniquely generated on the basis of the input signal.

Accordingly, it is impossible to generate the second address(es) when the unique relation is unknown. This makes it more difficult to read data from the memory as a basis for the generation of the one piece of data.

According to a fourth aspect of the present invention, the address generator uniquely generates at least two or more generated addresses on the basis of the input signal and outputs the generated addresses.

Accordingly, it is impossible to produce the generated addresses when the unique relation is unknown. This makes it more difficult to read data from the memory as a basis for the generation of the one piece of data.

According to a fifth aspect of the present invention, the address generator generates the second address(es) or the generated addresses by applying a given encryption processing to the input signal.

This prevents other people who do not know the encryption from extracting data from the memory. In encryption, the relation between an address before encrypted and the address after encrypted is very complicated, and it is therefore difficult to generate the address(es) uniquely determined from the input signal. That is, as a result, the security of the one piece of data is further enhanced.

According to a sixth aspect of the present invention, the address generator generates the second address(es) or the generated addresses on the basis of the input signal and a predetermined table.

This prevents other people who do not know the table from extracting data from the memory. Also, the address(es) can be uniquely generated from the input signal just by referring to the table. This shortens the processing time from the input of the input signal to the generation of the address(es).

According to a seventh aspect of the present invention, the address generator generates the second address(es) or the generated addresses by applying a given logical computation to the input signal.

This prevents other people who do not know the given logical computation code from extracting data from the memory. Also, the address(es) can be uniquely generated from the input signal just by performing the given logical computation. This shortens the processing time from the input of the input signal to the generation of the address(es) as compared with the process using encryption.

According to an eighth aspect of the present invention, the data generator generates the one piece of data by combining the at least two or more pieces of data read from the memory.

Accordingly, it is impossible, for other people who do not know the relation of the combining of data, to reproduce the one piece of data from the pieces of data read from the memory. This further enhances the security of the one piece of data.

According to a ninth aspect of the present invention, the data generator generates the one piece of data by performing a logical operation with the at least two or more pieces of data read from the memory.

Accordingly, it is impossible, for other people who do not know the relation of the logical operation of data, to reproduce the one piece of data from the pieces of data read from the memory. This further enhances the security of the one piece of data.

According to a tenth aspect of the present invention, the at least two or more pieces of data read from the memory include a first piece of data that contains error data, and a second piece of data that contains an error correcting code for correcting the error of the first piece of data. The data generator generates the one piece of data by correcting the error of the first piece of data by using the second piece of data.

Accordingly, it is impossible, for other people who do not know the mechanism of correction, to reproduce the one piece of data from pieces of data read from the memory. This further enhances the security of the one piece of data.

According to an eleventh aspect of the present invention, each page of the memory (or each page in a configuration in which each sector region of the memory is divided into pages) is composed of a NAND-type-memory data portion and a NAND-type-memory redundancy portion.

This provides a memory system with a more practical (i.e. lower-priced and larger-capacity) memory.

According to a twelfth aspect of the present invention, the address generator and the data generator are formed in one controller.

This provides a more compactly configured memory system.

According to a thirteenth aspect of the present invention, the memory system includes a first device and a second device. The first device contains the memory and the address generator. The second device is independent of the first device and contains the data generator.

Accordingly, the data generating method in the data generator (e.g. information about the combining processing, logical operation, correcting code, etc.) can be easily changed when needed, in such a way as to meet the need.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram used to describe one example of a first address generating scheme;

FIG. 6 is a diagram used to describe another example of the first address generating scheme;

FIG. 7 is a diagram used to describe one example of a second address generating scheme;

FIG. 8 is a diagram used to describe another example of the second address generating scheme;

FIG. 9 is a diagram used to describe generation of one piece of data by performing a logical operation between two pieces of data;

FIG. 12 is a block diagram illustrating another example of the configuration of the memory system.

DESCRIPTION OF THE PREFERRED EMBODIMENTS

Figure 1:
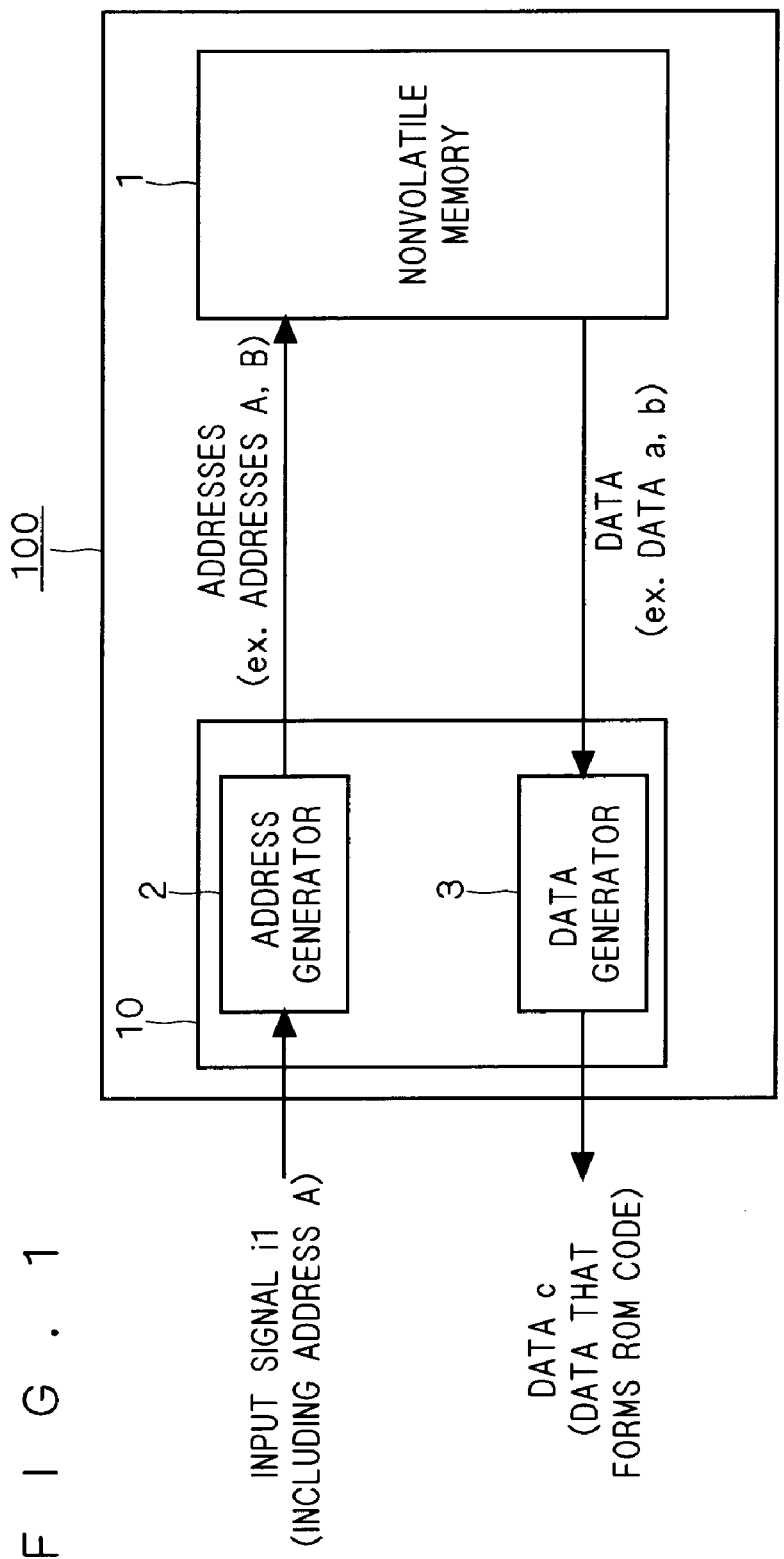
FIG. 1 is a block diagram illustrating the configuration of a memory system according to a first preferred embodiment.

The present invention will now be specifically described referring to the drawings illustrating the preferred embodiments.

First Preferred Embodiment

FIG. 1 is a block diagram illustrating the configuration of a memory system according to this preferred embodiment. As shown in FIG. 1, a memory system 100 includes a nonvolatile semiconductor memory (hereinafter referred to simply as a nonvolatile memory) 1, an address generator 2, and a data generator 3. In the memory system 100 of this preferred embodiment, the address generator 2 and the data generator 3 are provided in the same controller 10.

Figure 2:
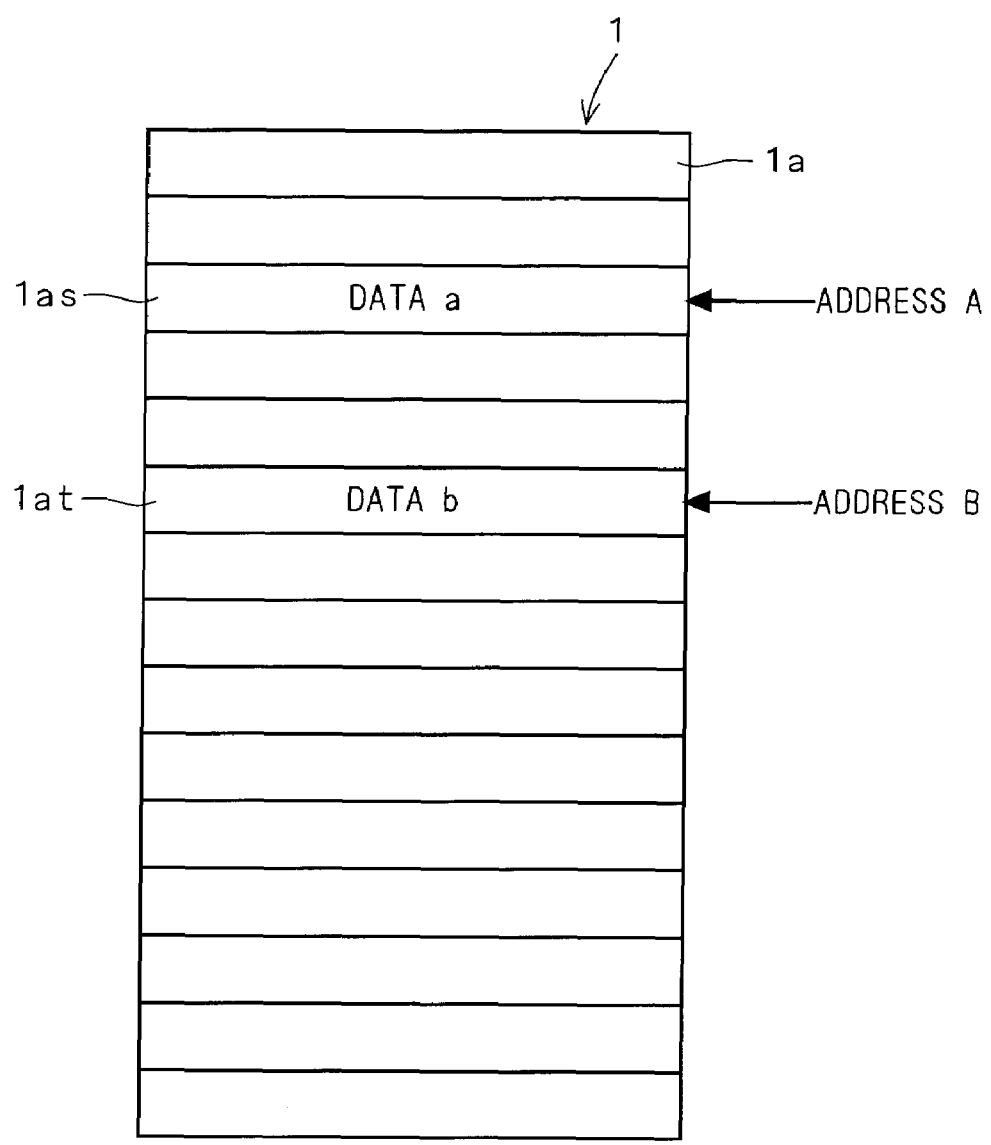
FIG. 2 is a diagram illustrating the configuration of a nonvolatile memory.

As shown in FIG. 2, the nonvolatile memory 1 is divided into a plurality of pages 1$a$. While the nonvolatile memory 1 of FIG. 2 is divided into "15" pages 1$a$, the number of divisions is not limited to this example but can be determined arbitrarily. The nonvolatile memory 1 is configured such that data can be read therefrom on a page-by-page basis. That is, in a process of reading data from the nonvolatile memory 1, data stored in one page 1$a$ is collectively read out as one piece of data through one read operation. Each page 1$a$ is assigned an address that defines its location in the nonvolatile memory 1.

The address generator 2 receives an inputted signal i1 (this signal can be regarded as a data read request from the outside of the memory system 100, and this signal is hereinafter referred to as an input signal i1), and the address generator 2 uniquely generates a given address or addresses on the basis of the input signal i1, and outputs at least two or more addresses. In this preferred embodiment, as shown in FIG. 1, the input signal i1 contains information about an address A (including the address A itself; the address A can be regarded as a first address). Then, in this preferred embodiment, the address generator 2 uniquely generates one or more address(es) (which can be regarded as second address(es)) on the basis of the input signal i1 (including the information about the address A). In this preferred embodiment, one address B is generated on the basis of the input signal i1. The address generator 2 then outputs the address A and the address B to the nonvolatile memory 1.

In this preferred embodiment, the address generator 2 uniquely generates the address B by applying a given encryption processing to the input signal i1. In this preferred embodiment, an encryption code used for the encryption processing is previously set for the address generator 2.

The data generator 3 generates a single piece of data on the basis of at least two or more pieces of data respectively read from different pages 1$a$ of the nonvolatile memory 1. The process of generating one piece of data on the basis of at least two or more pieces of data can be achieved by various methods. The data generator 3 of this preferred embodiment generates the one piece of data by combining the at least two or more pieces of data read from the nonvolatile memory 1.

Thus, on the basis of at least two or more addresses outputted from the address generator 2, the pieces of data in the nonvolatile memory 1 are read respectively from the individual pages 1a uniquely specified by the individual addresses (that is, pieces of data stored in different pages 1a are read respectively therefrom). For example, suppose the address generator 2 has outputted an address A and an address B. Then, a piece of data "a" stored in a page "1as" uniquely specified by the address A (see FIG. 2), and a piece of data "b" stored in a page "1at" uniquely specified by the address B (see FIG. 2), are read from the nonvolatile memory 1.

Then, in the example above, the data generator 3 generates one piece of data "c" on the basis of the two pieces of data "a" and "b" that were read from the nonvolatile memory 1. The generated one piece of data is a constituent element of the ROM code.

Here, data whose contents can be utilized for a certain purpose in its intact form is referred to as ROM code. Accordingly, the ROM code cannot be reproduced just by extracting all data stored in the nonvolatile memory 1. The ROM code can be generated by generating one piece of data c as a constituent element of the ROM code through the operation by the data generator 3 and collecting multiple pieces of data c.

That is, even when pieces of data a, b, etc. are extracted from the nonvolatile memory 1, the ROM code cannot be reproduced when the contents of the given operation performed by the data generator 3 are unknown (that is, it is impossible to obtain the data (a collection of data c) whose contents can be intactly utilized for a given purpose).

Figure 3:
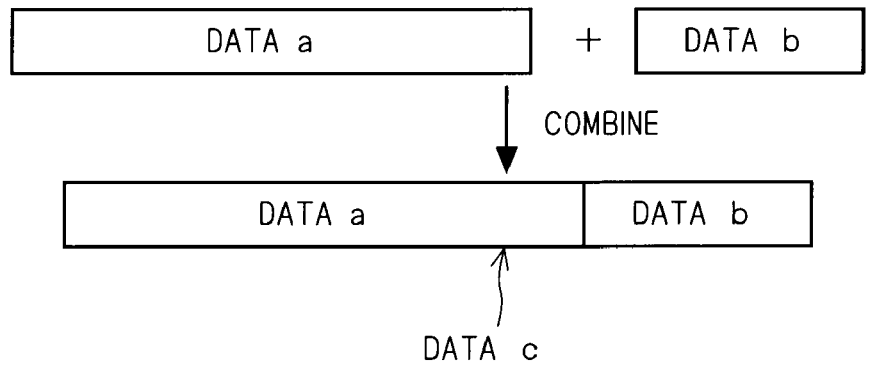
FIG. 3 is a diagram used to explain generation of one piece of data by combining two pieces of data.

After the data pieces a and b have been read from the nonvolatile memory 1 in the above described way, the data generator 3 of this preferred embodiment combines the data piece a and the data piece b as shown in FIG. 3 to generate one piece of data c (which can be regarded as data as a constituent element of the ROM code).

Figure 4:
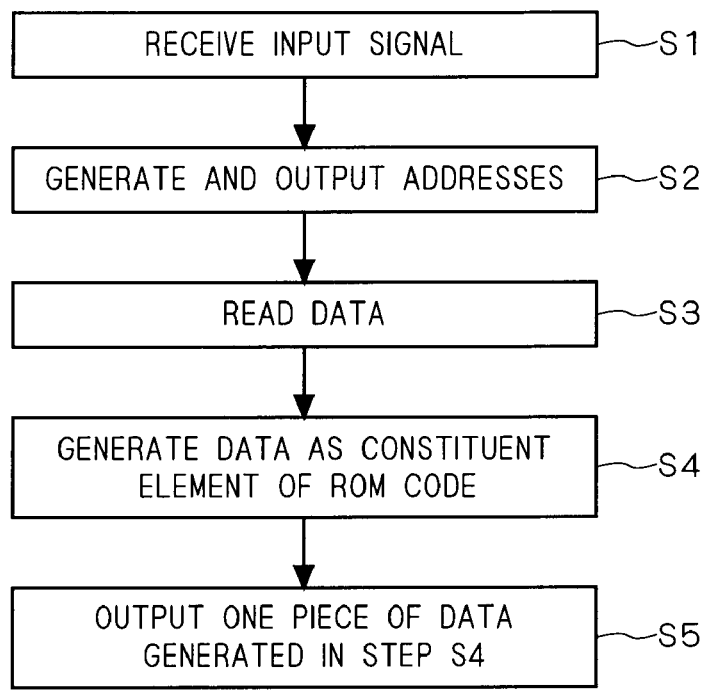
FIG. 4 is a flowchart illustrating the flow of operations of the memory system of the first preferred embodiment.

Next, the operation of the memory system of this preferred embodiment (i.e. a data reading and generating method) will be described referring to the diagram of FIG. 4 illustrating the flow of operation steps.

First, as shown in FIG. 1, the controller 10 receives the input signal i1 (specifically, at the input of the address generator 2 (Step 1)). In this preferred embodiment, the input signal i1 contains information about the address A (including the address A itself).

Next, the address generator 2 uniquely generates a given address or addresses on the basis of the input signal i1, and then outputs at least two or more addresses (Step S2). More specifically, the address generator 2 of this preferred embodiment applies a given encryption processing to the input signal i1. As mentioned earlier, a given encryption code is previously set for the address generator 2. Then, the address B is uniquely generated as a result of the encryption processing (Step S2). After the generation of the address, the address generator 2 outputs the address A contained in the input signal i1 and the address B thus generated (Step S2).

Next, the nonvolatile memory 1 receives the at least two or more addresses outputted from the address generator 2, and the pieces of data are read respectively from the pages 1a uniquely specified by the addresses (Step S3).

For example, suppose the address generator 2 outputted the address A and the address B. In this case, as shown in FIG. 2, the piece of data a stored in the page 1as uniquely specified by the address A, and the piece of data b stored in the page 1at uniquely specified by the address B, are read from the nonvolatile memory 1 (more specifically, from the pages 1as and 1at (Step S3)).

After the pieces of data have been read from the nonvolatile memory 1 in Step S3, the read pieces of data are inputted to the data generator 3. Receiving these pieces of data, the data generator 3 generates one piece of data (data as a constituent element of the ROM code) on the basis of the pieces of data (Step S4). Specifically, the data generator 3 of this preferred embodiment operates as shown below.

Suppose the data generator 3 received the pieces of data a and b read from the nonvolatile memory 1. Then, as shown in FIG. 3, the data generator 3 of this preferred embodiment combines the piece of data a and the piece of data b to generate one piece of data c (data as a constituent element of the ROM code (Step S4)). In the present invention, the ROM code is, for example, game data whose contents can be intactly utilized for a purpose like playing a game, and as can be seen from the description above, the ROM code cannot be reproduced just by extracting all data from the nonvolatile memory 1.

After having generated one piece of data as a constituent element of the ROM code in Step S4, the data generator 3 outputs the generated one piece of data to the outside of the memory system 100 (Step S5).

In this way, according to the memory system 100 of this preferred embodiment, a piece of data c, as a constituent element of the ROM code that can be actually utilized for a given purpose, is generated on the basis of at least two or more pieces of data read from the nonvolatile memory 1 (the data read from the nonvolatile memory 1 differs from data that the console expects; i.e. the ROM code cannot be reproduced with the intact data).

Accordingly, even if data pieces are extracted from the nonvolatile memory 1, it is impossible to reproduce the actually utilizable ROM code on the basis of all data extracted from the nonvolatile memory 1, when the data generating method in the data generator 3 is unknown (for example, when the method for generating the data piece c from the data pieces a and b (the interrelation) is unknown). Thus, the memory system 100 of this preferred embodiment enhances the security of the ROM code.

Furthermore, in the memory system 100 of this preferred embodiment, the address generator 2 generates a given address on the basis of the input signal i1 and outputs at least two or more addresses, in the process of reading at least two or more pieces of data from the nonvolatile memory 1 (the data read from the nonvolatile memory 1 differs from data that the console expects; i.e. the ROM code cannot be reproduced with the intact data).

Accordingly, when the address generating method in the address generator 2 is unknown (for example, when the method for producing the addresses A and B from the input signal i1 (the interrelation) is unknown), it is impossible to extract the pieces of data from the nonvolatile memory 1 as a basis for the generation of the one piece of data. Thus, in this respect, too, the memory system 100 of this preferred embodiment enhances the security of the ROM code.

Moreover, in the memory system 100 of this preferred embodiment, the input signal i1 contains a certain address, and another address is uniquely generated on the basis of the input signal i1.

Accordingly, when the unique relation is unknown, it is impossible to generate that another address, which makes it more difficult to read data from the nonvolatile memory 1 as a basis for the generation of the one piece of data.

This preferred embodiment has shown an example in which the input signal i1 contains certain address information, and the address generator 2 outputs at least one or more address(es) uniquely generated on the basis of the input signal i1 (which can be regarded as second address(es)) and the certain address contained in the input signal i1 (which can be regarded as a first address, and the method is referred to as a first address generating scheme).

However, another scheme can be adopted (referred to as a second address generating scheme) in which the input signal i1 contains no address information and the address generator 2 uniquely generates at least two or more addresses (which can be regarded as generated addresses) on the basis of the input signal i1 and outputs the generated addresses. For example, in the second address generating scheme, an address A (a generated address) and an address B (a generated address) are uniquely generated on the basis of the input signal i1.

In the second address generating scheme, as in the first address generating scheme, it is impossible to generate other addresses when the unique relation is unknown, which makes it more difficult to read data from the nonvolatile memory 1 as a basis for the generation of the one piece of data.

Also, in the memory system 100 of this preferred embodiment, the address generator 2 applies a given encryption processing to the input signal i1 to uniquely generate at least one or more address(es) on the basis of the input signal i1 (in the case of the first address generating scheme). In the second address generating scheme, too, the address generator 2 may generate at least two or more addresses (which can be regarded as generated addresses) by applying a given encryption processing to the input signal i1.

In this way, the address or addresses are generated by applying an encryption processing to the input signal i1, which prevents other people who do not know the encryption from extracting data from the nonvolatile memory 1. In encryption, the relation between the address before encrypted and the address after encrypted is very complicated, and it is therefore difficult to generate the address(es) (e.g. the address B in the case above) uniquely determined from the input signal i1. That is, as a result, the security of the ROM code is further enhanced.

Also, in the memory system 100 of this preferred embodiment, the data generator 3 generates one piece of data c (data as a constituent element of the ROM code) by combining at least two or more pieces of data read from the nonvolatile memory 1.

Accordingly, other people who do not know the relation of combining of data pieces cannot generate the one piece of data c from the pieces of data read from the nonvolatile memory 1. Accordingly, as a result, it is impossible to reproduce the ROM code that can be actually utilized for a given purpose. This further enhances the security of the ROM code.

In the example of the first address generating scheme, the address B is uniquely generated on the basis of the input signal i1 that contains information about the address A (see FIG. 1). That is, the address generator 2 outputs the two addresses A and B, and the two pieces of data a and b are read from the nonvolatile memory 1 on the basis of the two addresses, and the data generator 3 generates one piece of data c (data as a constituent element of the ROM code) on the basis of the two pieces of data a and b (see FIG. 1).

However, at least two or more addresses (for example, addresses B, C, etc.) may be uniquely generated on the basis of an input signal i1 that contains information about the address A. In this case, the address generator 2 outputs at least three or more addresses in total (for example, addresses A, B, C, etc.). Then, the same number of data pieces, as the number of outputted addresses, are read from the nonvolatile memory 1. Then, the data generator 3 generates one piece of data c (data as a constituent element of the ROM code) on the basis of the at least three or more pieces of data read from the nonvolatile memory 1.

In the second address generating scheme, the addresses A and B, for example, are uniquely generated on the basis of an input signal that contains no address information. Then, the address generator 2 outputs the generated two addresses A and B, and the two pieces of data a and b are read from the nonvolatile memory 1 on the basis of the two addresses, and the data generator 3 generates one piece of data c (data as a constituent element of the ROM code) on the basis of the two pieces of data a and b. The second address generating scheme may adopt the procedure shown below.

That is, at least three or more addresses (for example, addresses A, B, C, etc.) may be uniquely generated on the basis of an input signal that contains no address information. In this case, the address generator 2 outputs at least three or more addresses in total (for example, addresses A, B, C, etc.). Then, the same number of data pieces, as the number of outputted addresses, are read from the nonvolatile memory 1. Then, the data generator 3 generates one piece of data c (data as a constituent element of the ROM code) on the basis of the at least three or more pieces of data read from the nonvolatile memory 1.

In general, the memory region is divided into a plurality of sectors as units for data erasure, and each sector region is divided into a plurality of pages as units for data read. As is known from this, a sector has a larger capacity than a page.

The nonvolatile memory 1 of this preferred embodiment also has this memory configuration. In this case, in order to enhance the security of the ROM code, it is desired that the pieces of data read from the nonvolatile memory 1 on the basis of the input of one input signal i1 belong to different sectors (this makes it difficult to read the individual data pieces as a basis for the generation of one piece of data, and this enhances the security of the ROM code). The pieces of data are, of course, stored in different pages, as mentioned above. The details will be described in a sixth preferred embodiment later.

Second Preferred Embodiment

In the first address generating scheme of the first preferred embodiment, the address generator 2 generates at least one or more address(es) by applying a given encryption processing to an input signal i1 that contains address information. This preferred embodiment illustrates another address generating method by which the address generator 2 generates at least one or more address(es).

That is, in this preferred embodiment, the address generator 2 generates one or more given address(es) on the basis of an input signal and a given table (as shown in FIGS. 5 to 8, for example). The given table is previously set for the address generator 2. The address generator 2 uniquely generates the address(es) on the basis of the input signal provided thereto.

For example, suppose the first address generating scheme is adopted and the table of FIG. 5 is set for the address generator 2.

In this case, on the basis of the table of FIG. 5 and an input signal i1 that contains information about an address A (which can be regarded as a first address), the address generator 2 uniquely generates an address B (which can be regarded as a second address). Also, on the basis of the table of FIG. 5 and an input signal i2 that contains information about an address C (which can be regarded as a first address), the address generator 2 uniquely generates an address D (which can be regarded as a second address). Also, on the basis of the table of FIG. 5 and an input signal i3 that contains information about an address E (which can be regarded as a first address), the address generator 2 uniquely generates an address F (which can be regarded as a second address). Also, on the basis of the table of FIG. 5 and an input signal i4 that contains information about an address G (which can be regarded as a first address), the address generator 2 uniquely generates an address H (which can be regarded as a second address).

When the given addresses are generated as shown above according to the input signals i1 to i4 and FIG. 5, the address generator 2 outputs the addresses as shown in FIG. 5.

That is, when the input signal i1 is provided to the address generator 2, the address generator 2 outputs the addresses A and B. Also, when the input signal i2 is provided to the address generator 2, the address generator 2 outputs the addresses C and D. Also, when the input signal i3 is provided to the address generator 2, the address generator 2 outputs the addresses E and F. Also, when the input signal i4 is provided to the address generator 2, the address generator 2 outputs the addresses G and H.

For another example, suppose the first address generating scheme is adopted and the table of FIG. 6 is set for the address generator 2.

In this case, on the basis of the table of FIG. 6 and an input signal i1 that contains information about an address A (which can be regarded as a first address), the address generator 2 uniquely generates addresses B, C and D (which can be regarded as second addresses). Also, on the basis of the table of FIG. 6 and an input signal i2 that contains information about an address E (which can be regarded as a first address), the address generator 2 uniquely generates addresses F, G and H (which can be regarded as second addresses). Also, on the basis of the table of FIG. 6 and an input signal i3 that contains information about an address I (which can be regarded as a first address), the address generator 2 uniquely generates addresses J, K and L (which can be regarded as second addresses). Also, on the basis of the table of FIG. 6 and an input signal i4 that contains information about an address M (which can be regarded as a first address), the address generator 2 uniquely generates addresses N, O and P (which can be regarded as second addresses).

When the given addresses are generated as shown above according to the input signals i1 to i4 and FIG. 6, the address generator 2 outputs the addresses as shown in FIG. 6.

That is, when the input signal i1 is provided to the address generator 2, the address generator 2 outputs the addresses A, B, C and D. Also, when the input signal i2 is provided to the address generator 2, the address generator 2 outputs the addresses E, F, G and H. Also, when the input signal i3 is provided to the address generator 2, the address generator 2 outputs the addresses I, J, K and L. Also, when the input signal i4 is provided to the address generator 2, the address generator 2 outputs the addresses M, N, O and P.

As illustrated in FIGS. 5 and 6, when this preferred embodiment adopts the first address generating scheme, the address generator 2 uniquely generates at least one or more address(es) (which can be regarded as second address(es)) on the basis of a given table and an input signal that contains address information (which can be regarded as a first address), and outputs at least two or more addresses in total (which can be regarded as first and second addresses).

Also, for example, suppose the second address generating scheme is adopted and the table shown in FIG. 7 is set for the address generator 2. In the second address generating scheme, as described in the first preferred embodiment, the input signal provided to the address generator 2 does not contain address information.

In this case, on the basis of the table of FIG. 7 and an input signal I1, the address generator 2 uniquely generates addresses A and B (which can be regarded as generated addresses). Also, the address generator 2 uniquely generates addresses C and D (which can be regarded as generated addresses) on the basis of the table of FIG. 7 and an input signal I2. Also, the address generator 2 uniquely generates addresses E and F (which can be regarded as generated addresses) on the basis of the table of FIG. 7 and an input signal I3. Also, the address generator 2 uniquely generates addresses G and H (which can be regarded as generated addresses) on the basis of the table of FIG. 7 and an input signal I4.

When the given addresses are generated as shown above according to the input signals I1 to I4 and FIG. 7, the address generator 2 outputs the addresses as shown in FIG. 7.

That is, when the input signal I1 is provided to the address generator 2, the address generator 2 outputs the addresses A and B. Also, when the input signal I2 is provided to the address generator 2, the address generator 2 outputs the addresses C and D. Also, when the input signal I3 is provided to the address generator 2, the address generator 2 outputs the addresses E and F. Also, when the input signal I4 is provided to the address generator 2, the address generator 2 outputs the addresses G and H.

Also, for example, suppose the second address generating scheme is adopted and the table shown in FIG. 8 is set for the address generator 2. In the second address generating scheme, as described in the first preferred embodiment, the input signal provided to the address generator 2 does not contain address information.

In this case, on the basis of the table of FIG. 8 and an input signal I1, the address generator 2 uniquely generates addresses A, B and C (which can be regarded as generated addresses). Also, the address generator 2 uniquely generates addresses D, E and F (which can be regarded as generated addresses) on the basis of the table of FIG. 8 and an input signal I2. Also, the address generator 2 uniquely generates addresses G, H and I (which can be regarded as generated addresses) on the basis of the table of FIG. 8 and an input signal I3. Also, the address generator 2 uniquely generates addresses J, K and L (which can be regarded as generated addresses) on the basis of the table of FIG. 8 and an input signal I4.

When the given addresses are generated as shown above according to the input signals I1 to I4 and FIG. 8, the address generator 2 outputs the addresses as shown in FIG. 8.

That is, when the input signal I1 is provided to the address generator 2, the address generator 2 outputs the addresses A, B and C. Also, when the input signal I2 is provided to the address generator 2, the address generator 2 outputs the addresses D, E and F. Also, when the input signal I3 is provided to the address generator 2, the address generator 2 outputs the addresses G, H and I. Also, when the input signal I4 is provided to the address generator 2, the address generator 2 outputs the addresses J, K and L.

As illustrated in FIGS. 7 and 8, when this preferred embodiment adopts the second address generating scheme, the address generator 2 uniquely generates at least two or more addresses (which can be regarded as generated addresses) on the basis of an input signal and a given table, and outputs the at least two or more addresses in total (which can be regarded as generated addresses).

As described so far, in this preferred embodiment, the address generator 2 generates one or more given address(es) on the basis of a given table and an input signal, and outputs at least two or more addresses.

This prevents other people not knowing the given table (FIGS. 5 to 8) from extracting data from the nonvolatile memory 1. Also, the address generator 2 is capable of uniquely generating the address(es) on the basis of an input signal i1 just by referring to a given table. This shortens the processing time that the address generator 2 takes from the input of the input signal i1 to the generation of the address (es).

Third Preferred Embodiment

This preferred embodiment describes an operation in which the address generator 2 generates at least one or more address(es) according to an address generating method different from the methods of the first and second preferred embodiments.

That is, in this preferred embodiment, the address generator 2 generates at least one or more given address(es) by applying a given logical computation to an input signal. The code for the given logical computation is previously set for the address generator 2. The address generator 2 uniquely generates the address(es) on the basis of the input signal provided thereto.

Now, this preferred embodiment will be briefly described in an example that adopts the first address generating scheme defined in the first preferred embodiment. The example below describes an addition with offset from an address A to an address B.

For example, for the sake of simplicity of explanation, it is assumed that the nonvolatile memory 1 is divided into eight pages 1a including 0 to 7, and each page 1a is assigned an address (for simplicity, the addresses are assumed to be "0" to "7"). Also, it is assumed that an logical computation code, "(Address B)=(Address A)+4", is previously set for the address generator 2 of this preferred embodiment.

In this situation, suppose an input signal that contains information "address A=0" is provided to the address generator 2. Then, on the basis of the logical computation code, the address generator 2 generates an address B of "4". Also, when an input signal that contains information "address A=1" is provided to the address generator 2, the address generator 2 generates an address B of "5" on the basis of the logical computation code. Also, when an input signal that contains information "address A=2" is provided to the address generator 2, the address generator 2 generates an address B of "6" on the basis of the logical computation code.

Also, suppose an input signal that contains information "address A=4" is provided to the address generator 2. Then, as a result of the computation by the address generator 2 on the basis of the logical computation code, the address B reaches "8", and so the address is lapped to the first one. Thus, the address generator 2 generates an address B of "0". In the same way, when an input signal that contains information "address A=5" is provided to the address generator 2, the address generator 2 generates an address B of "1" on the basis of the logical computation code.

Considering the description above, it is seen that this preferred embodiment can be easily applied to the second address generating scheme (that is, a method in which given addresses are generated by a given logical computation to an input signal). For example, the method shown below can be adopted.

That is to say, when this preferred embodiment is applied to the second address generating scheme, an input signal i contains address information external to the memory region of the nonvolatile memory 1, for example. Also, a plurality of offset computation expressions are set for the address generator 2. In this configuration, when the input signal i is provided to the address generator 2, it performs an logical computation using the plurality of offset computation expressions to generate at least two or more addresses that belong to the memory region of the nonvolatile memory 1. The address generator 2 then sends the generated at least two or more addresses to the nonvolatile memory 1.

As described above, in this preferred embodiment, the address generator 2 generates at least one or more address(es) (which can be regarded as second address(es) or generated addresses) by applying a given logical computation to the input signal.

This prevents other people who do not know the given logical computation code from extracting data from the nonvolatile memory 1. Also, the address generator 2 is capable of uniquely generating the addresses on the basis of the input signal just by performing the given logical computation. This shortens the processing time that the address generator 2 takes from the input of the input signal to the generation of the address(es), as compared with the process using encryption described in the first preferred embodiment.

Fourth Preferred Embodiment

In the first preferred embodiment, the data generator 3 generates one piece of data c by combining at least two or more pieces of data read from the nonvolatile memory 1. This preferred embodiment illustrates another data generating method by which the data generator 3 generates the one piece of data c.

That is to say, as shown in FIG. 9, the data generator 3 of this preferred embodiment generates one piece of data c (data as a constituent element of the ROM code) by performing a logical operation (e.g. exclusive OR) with at least two or more pieces of data (e.g. data pieces a and b) read from the nonvolatile memory 1.

For example, it is assumed that the data pieces a and b are formed of the same numbers of bits. In this case, the exclusive OR, for example, of the first bit of the data piece a and the first bit of the data piece b is calculated. Then, the calculated result is set as the first bit of the data piece c. Also, the exclusive OR, for example, of the second bit of the data piece a and the second bit of the data piece b is calculated. The calculated result is then set as the second bit of the data piece c. Also, the exclusive OR, for example, of the nth bit of the data piece a and the nth bit of the data piece b is calculated. The calculated result is then set as the nth bit of the data piece c. In this way, the data generator 3 generates one piece of data c (data as a constituent element of the ROM code) by applying the logical operation to all bits of the pieces of data a and b.

As described above, the data generator 3 of this preferred embodiment generates one piece of data c (data as a constituent element of the ROM code) by performing a logical operation with at least two or more pieces of data read from the nonvolatile memory 1.

Accordingly, other people who do not know the relation of the logical operation of data cannot reproduce the ROM code actually utilizable for a certain purpose, from data pieces read from the nonvolatile memory 1. This further enhances the security of the ROM code.

Fifth Preferred Embodiment

This preferred embodiment illustrates an operation in which the data generator 3 generates one piece of data c by another data generating method that is different from those of the first and fourth preferred embodiments.

That is to say, in this preferred embodiment, at least two or more pieces of data read from the nonvolatile memory 1 include a first piece of data that contains error data and a second piece of data formed of an error correcting code for correcting the error of the first piece of data. The data generator 3 generates one piece of data c (data as a constituent element of the ROM code) by correcting the error of the first piece of data by using the second piece of data. That is, the one piece of data c (a constituent element of the ROM code) corresponds to the first piece of data whose error has been corrected.

The operation of data error correction can adopt various known methods. For example, the operation can adopt the method disclosed in Japanese Patent Application Laid-Open No. 2005-44427, for example.

As described so far, the data generator 3 of this preferred embodiment generates one piece of data c (data as a constituent element of the ROM code) by correcting error of a first piece of data by using a second piece of data.

Accordingly, other people who do not know that the data read from the nonvolatile memory 1 is composed of the first and second pieces of data (the correcting mechanism) cannot reproduce the ROM code actually utilizable for a certain purpose, from the data pieces read from the nonvolatile memory 1. This further enhances the security of the ROM code.

Sixth Preferred Embodiment

In the preferred embodiments explained so far, the nonvolatile memory 1 is divided into a plurality of pages 1a, and data can be read on a page-by-page basis. Now, in general, the nonvolatile memory 1 is divided into a plurality of sectors, and data can be erased on a sector-by-sector basis. As mentioned in the first preferred embodiment, each sector includes a plurality of pages 1a (that is, each sector is divided into a plurality of pages 1a).

Figure 10:
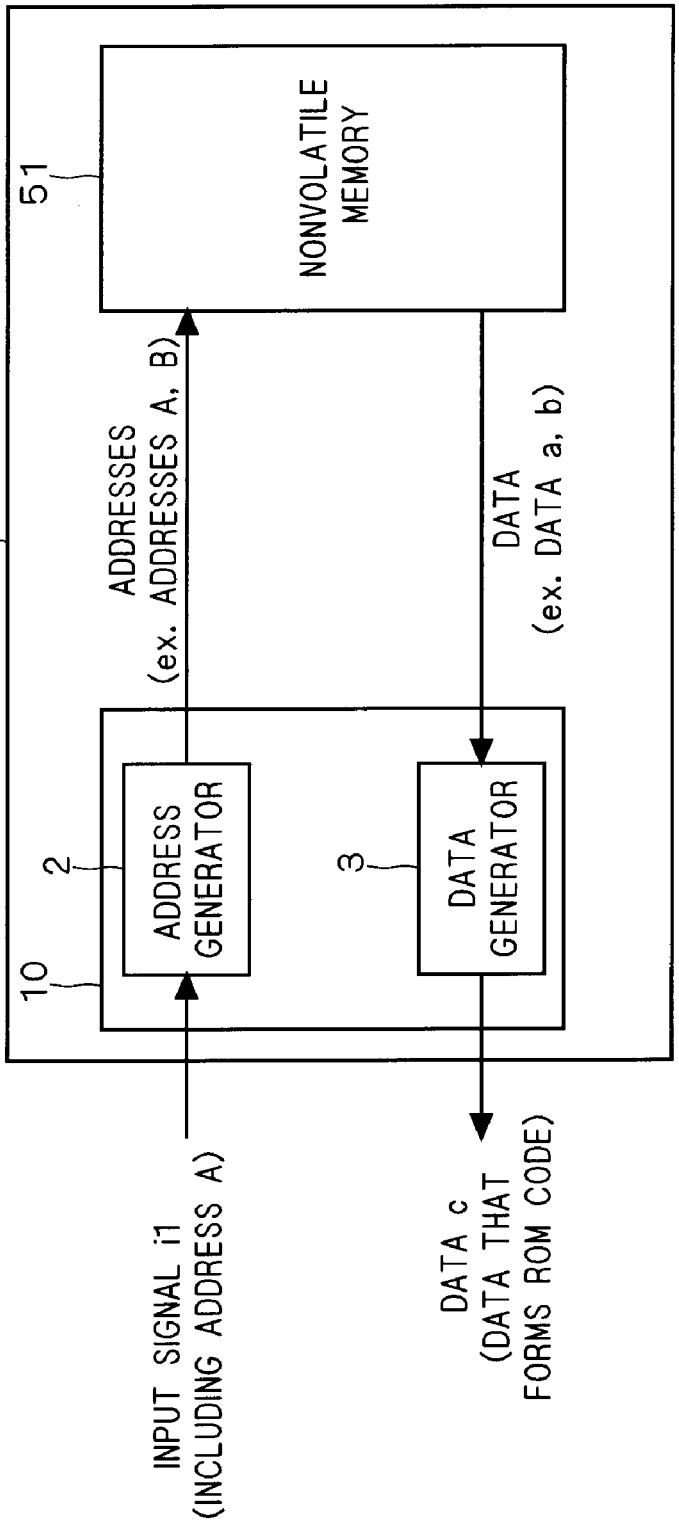
FIG. 10 is a block diagram illustrating the configuration of a memory system according to a fifth preferred embodiment.

In a memory system 200 of this preferred embodiment, the nonvolatile memory 1 of the memory system 100 of the preferred embodiments is replaced by a nonvolatile memory 51 divided into a plurality of sectors (see FIG. 10).

Figure 11:
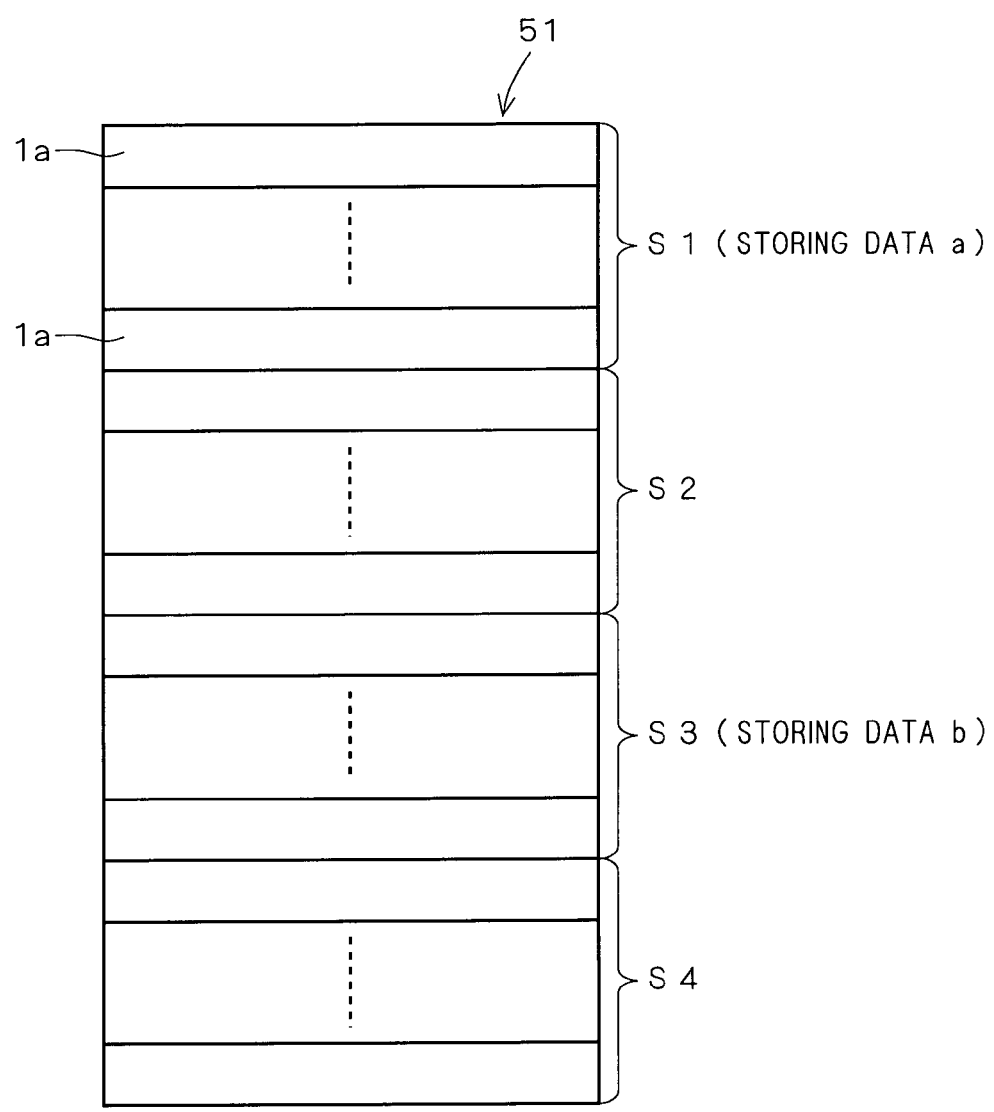
FIG. 11 is a diagram illustrating the configuration of a nonvolatile memory.

As shown in FIG. 11, the nonvolatile memory 51 of this preferred embodiment is divided into a plurality of sectors S1 to S4. In FIG. 11, the nonvolatile memory 51 is divided into "4" sectors S1 to S4, but the number of divisions is not limited by this example but can be determined arbitrarily.

The nonvolatile memory 51 is capable of data erasure on a sector-by-sector basis. That is, in a process of erasing data stored in the nonvolatile memory 51, data stored in one sector is collectively erased as one piece of data through one erase operation. As mentioned above, each of the sectors S1 to S4 has a plurality of pages 1a (that is, each of the sectors S1 to S4 is divided into a plurality of pages 1a). As described in the first preferred embodiment, the pages 1a are formed of units for data read.

In this preferred embodiment, too, the data generator 3 reads at least two or more pieces of data from the nonvolatile memory 51 in the process of generating data c. In FIG. 11, the at least two or more pieces of data, read from the nonvolatile memory 51, are stored in different ones of the sectors S1 to S4. In other words, in the nonvolatile memory 51, the at least two or more pieces of data are located in such a way that they are stored in different ones of the sectors S1 to S4.

For example, suppose the data generator 3 requires pieces of data a and b to generate one piece of data c. In this case, as shown in FIG. 11, for example, the data piece a is stored in the sector S1, and the data piece b is stored in the sector S3. As can be clearly seen, the sector S1 and the sector S3 are different sectors.

In this preferred embodiment, the address generator 2 is designed to be able to generate at least one or more address (es) (or at least two or more addresses) such that at least two or more pieces of data stored in the above-described manner can be read in the process of generating data c.

For example, it is assumed that the generation of the one piece of data c requires pieces of data a and b. It is also assumed that the data piece a is stored in a first page 1a belonging to the sector S1, and the data piece b is stored in a second page 1a belonging to the sector S3. In this case, the address generator 2 generates one or two address(es) and outputs two addresses that specify the first and second pages 1a.

The memory system 200 of this preferred embodiment operates in the same way as that of the first preferred embodiment. However, the nonvolatile memory 51 and the address generator 2 are designed as described above. Thus, at least two or more pieces of data, which are necessary to generate one piece of data c, are read from different ones of the sectors S1 to S4.

Accordingly, the memory system 200 of this preferred embodiment offers the same effect as that described in the first preferred embodiment (i.e. the effect to enhance the security of the ROM code).

The techniques of the above-described preferred embodiments can be applied to the memory system 200 of this preferred embodiment. Accordingly, the same effects as those of the individual preferred embodiments are obtained when the embodiments are applied to the memory system 200.

At least two or more pieces of data read from the nonvolatile memory 51 belong to (or are stored in) different ones of the sectors S1 to S4. Accordingly, it is not easy to read the data pieces as a basis for the generation of one piece of data. This further enhances the security of the ROM code.

Other Preferred Embodiments

The nonvolatile memories 1 and 51 of the above-described preferred embodiments (more specifically, the pages 1a as units of data read shown in FIGS. 2 and 11) may adopt the configuration below. That is, each page 1a is composed of a NAND-type-memory data portion and a NAND-type-memory redundancy portion.

By adopting this configuration for each page 1a shown in FIGS. 2 and 11, it is possible to provide more practical (i.e. lower-priced and larger-capacity) nonvolatile memories 1 and 51 in the memory systems 100 and 200.

Also, in the above-described preferred embodiments, as shown in FIGS. 1 and 10, the address generator 2 and the data generator 3 are provided in the same controller 10. This offers more compactly configured memory systems 100 and 200.

Unlike this configuration (unlike the configuration as illustrated in FIGS. 1 and 10), the memory system of the preferred embodiments may be configured with a first device in which the nonvolatile memory 1 and the address generator 2 are provided and a second device in which the data generator 3 is provided. The first device and the second device are discrete and independent devices, and they can communication with each other.

As shown in FIG. 12, the memory system 100 or 200 includes a first device 300 and a second device 400. The first device 300 includes the nonvolatile memory 1 (or 51) and the address generator 2. The second device 400 includes the data generator 3. The memory systems 100 and 200 operate as explained in the preferred embodiments.

For example, in a specific example of the configuration shown in FIG. 12, the second device 400 is provided as hardware or software in the main body of a game machine, and the first device 300 is provided as a device that can be attached to and detached from the main body of the game machine.

As shown in FIG. 12, by configuring the memory system 100 or 200 with the first device 300 and the second device 400 that is discrete and independent from the first device 300, the method of data generation in the data generator 3 (e.g. information about the combining processing, logical operation, correcting code, etc.) can be easily changed when needed, in such a way as to meet the need.

In the above-described preferred embodiments, data pieces (e.g. data pieces a and b) are located in a distributed manner for individual units of read (i.e. in individual pages 1a) or for individual units of erasure (i.e. in individual sectors S1 to S4). However, for example, the data pieces (e.g. data pieces a and b) may be located in a distributed manner for individual units of write in the nonvolatile memory.

While the invention has been described in detail, the foregoing description is in all aspects illustrative and not restrictive. It is understood that numerous other modifications and variations can be devised without departing from the scope of the invention.

What is claimed is:

1. A memory system comprising: a memory that is divided into a plurality of pages and capable of data reading on a page-by-page basis;
   an address generator that generates one or more given address(es) on the basis of an input signal and outputs at least two or more addresses;
   said memory being configured such that at least two or more pieces of data can be read respectively from different ones of said pages uniquely specified respectively by said at least two or more addresses outputted from said address generator; and
   a data generator that generates one piece of data on the basis of said at least two or more pieces of data read respectively from the different ones of said pages of said memory,
   wherein said input signal is a signal that includes a first address, and said address generator outputs said first address and at least one or more second address(es) that are uniquely generated on the basis of said input signal.

2. The memory system according to claim 1,
   wherein said memory is divided into a plurality of sectors each including a plurality of said pages, and said memory is capable of data erasure on a sector-by-sector basis, and
   the different ones of said pages of said memory where said at least two or more pieces of data are stored belong to different ones of said sectors.

3. The memory system according to claim 2,
   wherein said input signal is a signal that includes a first address, and said address generator outputs said first address and at least one or more second address(es) that are uniquely generated on the basis of said input signal.

4. The memory system according to claim 1, wherein said address generator uniquely generates at least two or more generated addresses on the basis of said input signal and outputs said generated addresses.

5. The memory system according to claim 2, wherein said address generator uniquely generates at least two or more generated addresses on the basis of said input signal and outputs said generated addresses.

6. The memory system according to claim 1, wherein said address generator generates said second address(es) by applying a given encryption processing to said input signal.

7. The memory system according to claim 3, wherein said address generator generates said second address(es) by applying a given encryption processing to said input signal.

8. The memory system according to claim 4, wherein said address generator generates said generated addresses by applying a given encryption processing to said input signal.

9. The memory system according to claim 5, wherein said address generator generates said generated addresses by applying a given encryption processing to said input signal.

10. The memory system according to claim 1, wherein said address generator generates said second address(es) on the basis of said input signal and a predetermined table.

11. The memory system according to claim 3, wherein said address generator generates said second address(es) on the basis of said input signal and a predetermined table.

12. The memory system according to claim 4, wherein said address generator generates said generated addresses on the basis of said input signal and a predetermined table.

13. The memory system according to claim 5, wherein said address generator generates said generated addresses on the basis of said input signal and a predetermined table.

14. The memory system according to claim 1, wherein said address generator generates said second address(es) by applying a given logical computation to said input signal.

15. The memory system according to claim 3, wherein said address generator generates said second address(es) by applying a given logical computation to said input signal.

16. The memory system according to claim 4, wherein said address generator generates said generated addresses by applying a given logical computation to said input signal.

17. The memory system according to claim 5, wherein said address generator generates said generated addresses by applying a given logical computation to said input signal.

18. The memory system according to claim 1, wherein said data generator generates said one piece of data by combining said at least two or more pieces of data read from said memory.

19. The memory system according to claim 2, wherein said data generator generates said one piece of data by combining said at least two or more pieces of data read from said memory.

20. The memory system according to claim 1, wherein said data generator generates said one piece of data by performing a logical operation with said at least two or more pieces of data read from said memory.

21. The memory system according to claim 2, wherein said data generator generates said one piece of data by performing a logical operation with said at least two or more pieces of data read from said memory.

22. The memory system according to claim 1,
   wherein said at least two or more pieces of data read from said memory include:
   a first piece of data that contains error data; and a second piece of data that contains an error correcting code for correcting the error of said first piece of data, and said data generator generates said one piece of data by correcting the error of said first piece of data by using said second piece of data.

23. The memory system according to claim 2, wherein said at least two or more pieces of data read from said memory include:

a first piece of data that contains error data; and a second piece of data that contains an error correcting code for correcting the error of said first piece of data, and said data generator generates said one piece of data by correcting the error of said first piece of data by using said second piece of data.

24. The memory system according to claim 1, wherein each said page of said memory is composed of a NAND-type-memory data portion and a NAND-type-memory redundancy portion.

25. The memory system according to claim 2, wherein each said sector of said memory is divided into ones of said pages, and each said page is composed of a NAND-type-memory data portion and a NAND-type-memory redundancy portion.

26. The memory system according to claim 1, wherein said address generator and said data generator are formed in one controller.

27. The memory system according to claim 2, wherein said address generator and said data generator are formed in one controller.

28. The memory system according to claim 1, which comprises:

a first device in which said memory and said address generator are formed; and a second device which is independent of said first device and in which said data generator is formed.

29. The memory system according to claim 2, which comprises:

a first device in which said memory and said address generator are formed; and a second device which is independent of said first device and in which said data generator is formed.

30. A data reading and generating method for reading data from a memory that is divided into a plurality of pages and capable of data reading on a page-by-page basis, and generating data on the basis of the read data, said method comprising the steps of:

(A) generating one or more given address(es) on the basis of an input signal and outputting at least two or more addresses;

(B) reading at least two or more pieces of data respectively from ones of said pages uniquely specified respectively by said at least two or more addresses outputted in said step (A); and (C) generating one piece of data on the basis of said at least two or more pieces of data read from the different ones of said pages in said step (B), wherein said input signal includes a first address, and said step (A) outputs said first address and at least one or more second address(es) that are uniquely generated on the basis of said input signal.

31. The data reading and generating method according to claim 30, wherein said memory is divided into a plurality of sectors each including a plurality of said pages, and said memory is capable of data erasure on a sector-by-sector basis, and said step (B) reads the at least two or more pieces of data respectively from the ones of said pages that are uniquely specified respectively by said addresses and that belong to different ones of said sectors.

32. The data reading and generating method according to claim 31, wherein said input signal includes a first address, and said step (A) outputs said first address and at least one or more second address(es) that are uniquely generated on the basis of said input signal.

33. The data reading and generating method according to claim 30, wherein said step (A) uniquely generates at least two or more generated addresses on the basis of said input signal and outputs said generated addresses.

34. The data reading and generating method according to claim 31, wherein said step (A) uniquely generates at least two or more generated addresses on the basis of said input signal and outputs said generated addresses.

35. The data reading and generating method according to claim 30, wherein said step (A) generates said second address(es) by applying a given encryption processing to said input signal.

36. The data reading and generating method according to claim 32, wherein said step (A) generates said second address(es) by applying a given encryption processing to said input signal.

37. The data reading and generating method according to claim 33, wherein said step (A) generates said generated addresses by applying a given encryption processing to said input signal.

38. The data reading and generating method according to claim 34, wherein said step (A) generates said generated addresses by applying a given encryption processing to said input signal.

39. The data reading and generating method according to claim 30, wherein said step (A) generates said second address(es) on the basis of said input signal and a predetermined table.

40. The data reading and generating method according to claim 32, wherein said step (A) generates said second address(es) on the basis of said input signal and a predetermined table.

41. The data reading and generating method according to claim 33, wherein said step (A) generates said generated addresses on the basis of said input signal and a predetermined table.

42. The data reading and generating method according to claim 34, wherein said step (A) generates said generated addresses on the basis of said input signal and a predetermined table.

43. The data reading and generating method according to claim 30, wherein said step (A) generates said second address(es) by applying a given logical computation to said input signal.

44. The data reading and generating method according to claim 32, wherein said step (A) generates said second address(es) by applying a given logical computation to said input signal.

45. The data reading and generating method according to claim 33, wherein said step (A) generates said generated addresses by applying a given logical computation to said input signal.

46. The data reading and generating method according to claim 34, wherein said step (A) generates said generated addresses by applying a given logical computation to said input signal.

47. The data reading and generating method according to claim 30, wherein said step (C) generates said one piece of data by combining said at least two or more pieces of data read in said step (B).

48. The data reading and generating method according to claim 31, wherein said step (C) generates said one piece of data by combining said at least two or more pieces of data read in said step (B).

49. The data reading and generating method according to claim 30, wherein said step (C) generates said one piece of data by performing a logical operation with said at least two or more pieces of data read in said step (B).

50. The data reading and generating method according to claim 31, wherein said step (C) generates said one piece of data by performing a logical operation with said at least two or more pieces of data read in said step (B).

51. The data reading and generating method according to claim 30,
wherein said at least two or more pieces of data read in said step (B) include:
a first piece of data that contains error data; and
a second piece of data that contains an error correcting code for correcting the error of said first piece of data, and
said step (C) generates said one piece of data by correcting the error of said first piece of data by using said second piece of data.

52. The data reading and generating method according to claim 31,
wherein said at least two or more pieces of data read in said step (B) include:
a first piece of data that contains error data; and
a second piece of data that contains an error correcting code for correcting the error of said first piece of data, and
said step (C) generates said one piece of data by correcting the error of said first piece of data by using said second piece of data.

* * * * *